United States Patent
Lin et al.

(10) Patent No.: US 11,170,867 B2
(45) Date of Patent: Nov. 9, 2021

(54) TEST SYSTEM

(71) Applicant: Realtek Semiconductor Corporation, Hsinchu (TW)

(72) Inventors: Shih-Chieh Lin, Taoyuan (TW); Sheng-Lin Lin, Taichung (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/782,204

(22) Filed: Feb. 5, 2020

(65) Prior Publication Data

US 2020/0273532 A1 Aug. 27, 2020

(30) Foreign Application Priority Data

Feb. 21, 2019 (TW) .................................. 108105871

(51) Int. Cl.
*G11C 29/00* (2006.01)
*G11C 29/38* (2006.01)
*G11C 29/14* (2006.01)
*G11C 11/41* (2006.01)

(52) U.S. Cl.
CPC .............. *G11C 29/38* (2013.01); *G11C 29/14* (2013.01); *G11C 11/41* (2013.01)

(58) Field of Classification Search
CPC ......... G11C 29/38; G11C 29/14; G11C 11/41; G11C 2029/0405; G11C 29/32
See application file for complete search history.

(56) References Cited

U.S. PATENT DOCUMENTS

| | | | |
|---|---|---|---|
| 6,973,631 B2 | 12/2005 | Huang et al. | |
| 8,984,354 B2 | 3/2015 | Kuo et al. | |
| 2008/0022176 A1* | 1/2008 | Anzou | G11C 29/38 714/733 |
| 2012/0304032 A1* | 11/2012 | Kuo | G11C 29/1201 714/733 |
| 2015/0262709 A1* | 9/2015 | Anzou | G11C 7/1006 365/189.07 |

* cited by examiner

*Primary Examiner* — Uyen Smet
(74) *Attorney, Agent, or Firm* — Locke Lord LLP; Tim Tingkang Xia, Esq.

(57) ABSTRACT

A test system is provided that includes a memory test circuit, a memory, an input logic circuit, a bypass circuit, an output logic circuit and a register. The register is operated as a pipeline register of the memory test circuit and the output logic circuit. In a first test mode, the memory test circuit transmits a first test signal to the memory such that the memory outputs a memory output test signal to be stored in the register and further transmitted to the memory test circuit or the output logic circuit to perform test.

9 Claims, 4 Drawing Sheets

_TEST SYSTEM_

RELATED APPLICATIONS

This application claims priority to Taiwan Application Serial Number 108105871, filed Feb. 21, 2019, which is herein incorporated by reference.

BACKGROUND

Field of Invention

The present invention relates to a test technology. More particularly, the present invention relates to a test system.

Description of Related Art

In conventional technologies, two types of test are performed on an embedded static random access memory (eSRAM). One of the tests is to use a memory test circuit to perform test on the memory. The other one of the tests is to perform test on the memory related circuit such that a test is performed on an output logic circuit behind the memory by using an input logic circuit. The latter one is also called scan test. However, in order to perform the test described above and determine whether the function of the output logic circuit operates normally, a multiple of registers are required to avoid the data error caused by the latency of the memory. Such a configuration increases the hardware cost of the test circuit.

Accordingly, what is needed is a test system to address the issues mentioned above.

SUMMARY

An aspect of the present invention is to provide a test system that includes a memory test circuit, a memory, an input logic circuit, a bypass circuit, an output logic circuit and a register. The memory is electrically coupled to the memory test circuit. The input logic circuit is electrically coupled to the memory. The bypass circuit is selectively electrically coupled to one of the memory test circuit and the input logic circuit. The register includes an input terminal and an output terminal, wherein the input terminal is selectively electrically coupled to one of the memory and the bypass circuit, and the output terminal is electrically coupled to the memory test circuit and the output logic circuit, and the register is operated as a pipeline register of the memory test circuit and the output logic circuit. In a first test mode, the memory test circuit transmits a first test signal to the memory such that the memory outputs a memory output test signal to be stored in the register and further transmitted to the memory test circuit or the output logic circuit to perform test based on a first transmission result.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
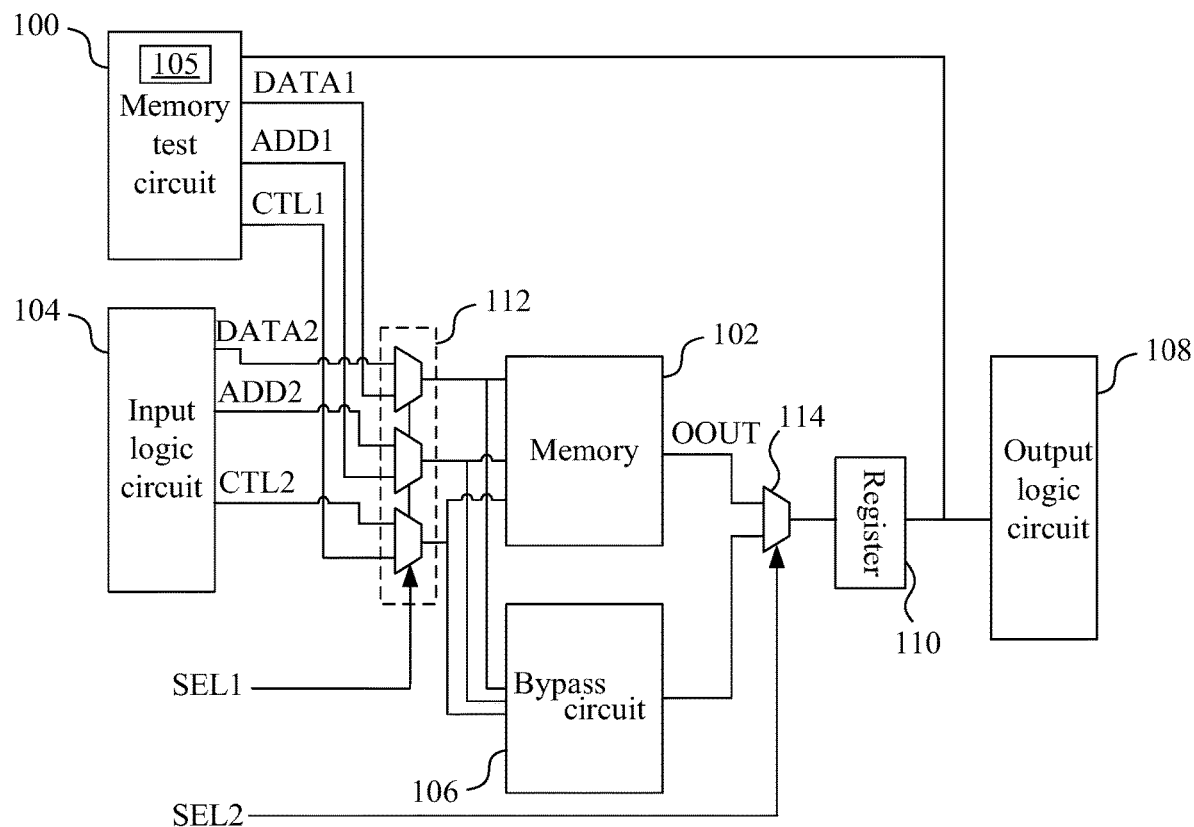
FIG. 1 is block diagram of a test system in an embodiment of the present invention.

Reference is made to FIG. 1. FIG. 1 is block diagram of a test system 1 in an embodiment of the present invention. The test system 1 includes a memory test circuit 100, a memory 102, an input logic circuit 104, a bypass circuit 106, an output logic circuit 108, a register 110, a multiplexer 112 and a multiplexer 114.

Through the multiplexer 112, either the memory test circuit 100 or the input logic circuit 104 is selectively electrically coupled to the memory 102.

In an embodiment, the multiplexer 112 performs selection based on a selection signal SEL1. For example, when the selection signal SEL1 is at a first voltage level, the multiplexer 112 electrically couples the memory test circuit 100 to the memory 102. When the selection signal SEL1 is at a second voltage level, the multiplexer 112 electrically couples the input logic circuit 104 to the memory 102.

In an embodiment, the memory 102 can be such as, but not limited to an embedded static random access memory (eSRAM) and is configured to store the signal inputted from either the memory test circuit 100 or the input logic circuit 104 and further output the stored signal.

In an embodiment, the memory test circuit 100 is a built-in self test (GIST) circuit and is configured to generate a group of signals that include such as, but not limited to a data signal DATA1, an address signal ADD1 and a control signal CTL1 and transmit the group of signals to the memory 102 through the multiplexer 112.

In an embodiment, the input logic circuit 104 is configured to generate a group of signals that include such as, but not limited to a data signal DATA2, an address signal ADD2 and a control signal CTL2 and transmit the group of signals to the memory 102 through the multiplexer 112.

On the other hand, through the multiplexer 112, either the memory test circuit 100 or the input logic circuit 104 is selectively electrically coupled to the bypass circuit 106. The bypass circuit 106 is configured to transmit the signal inputted from either the memory test circuit 100 or the input logic circuit 104 to the other circuits. In an embodiment, the bypass circuit 106 only transmits signals without storing the signals.

The register 110 has an input terminal and an output terminal. Through the multiplexer 114, either the memory 102 or the bypass circuit 106 is selectively electrically coupled to the input terminal of the register 110 such that the input terminal of the register 110 receives the signals from either the memory 102 or the bypass circuit 106 and stores the signals.

The output terminal of the register 110 is electrically coupled to the memory test circuit 100 and the output logic circuit 108 to further transmit the stored signals to the memory test circuit 100 and the output logic circuit 108.

In an operation mode, the register 110 is operated as a pipeline register of the output logic circuit 108.

More specifically, in the operation mode, the input logic circuit 104 transmits such as, but not limited to the input operation signal including the data signal DATA2, the address signal ADD2 and the control signal CTL2 to be stored in the memory 102. The memory 102 further outputs a memory output signal OOUT to be stored in the register 110 such that the register 110 transmits the memory output signal OOUT to the output logic circuit 108. Due to the existence of the register 110, the signal received by the output logic circuit 108 is not affected by the latency of the memory 102. The data error caused by the timing violation can be avoided.

Figure 2:
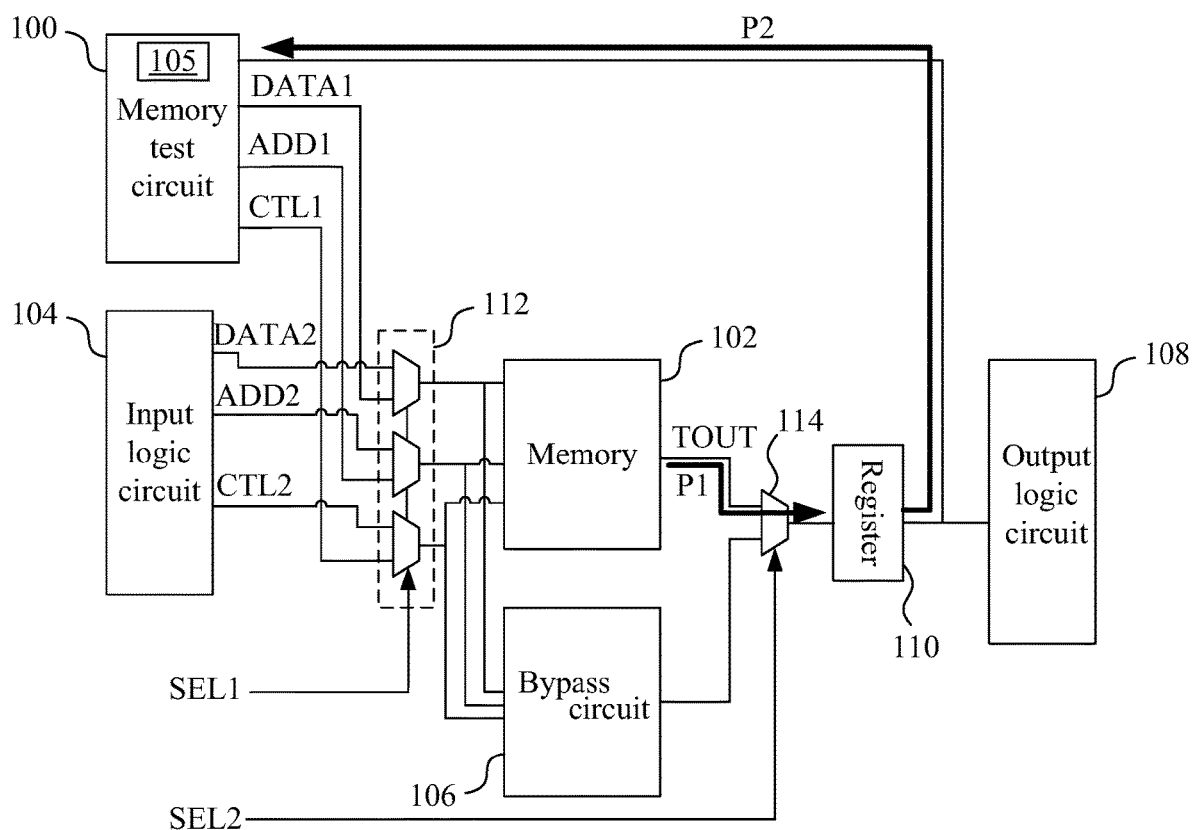
FIG. 2 is the block diagram of the test system operated in the first test mode in an embodiment of the present invention.

Reference is now made to FIG. 2. FIG. 2 is the block diagram of the test system 1 operated in the first test mode in an embodiment of the present invention.

In a first test mode, according to the connection of the multiplexer 112 controlled by the selection signal SEL1, the memory test circuit 100 transmits a first test signal including such as, but not limited to, the data signal DATA1, the address signal ADD1 and the control signal CTL1 to be stored in the memory 102. Subsequently, the memory 102 outputs and transmits a memory output test signal TOUT to be stored in the register 110 according to the connection of the multiplexer 114 controlled by the selection signal SEL2. The signal stored by the register 110 is further transmitted to either the memory test circuit 100 or the output logic circuit 108.

As a result, in the first test mode, the register 110 is operated as a pipeline register of the memory test circuit 100 and the output logic circuit 108.

More specifically, due to the existence of the register 110, the signal received by the memory test circuit 100 is not affected by the latency of the memory 102. The data error caused by the timing violation can be avoided.

In an embodiment, the memory test circuit 100 includes a comparator 105 configured to perform comparison between the first test signal and the first transmission result transmitted form the register 110 to the memory test circuit 100 to test the memory 102.

Under such a condition, besides performing test on the memory 102, a first path P1 from the memory 102 to the register 110 and a second path P2 from the register 110 to the memory test circuit 100 are tested.

Figure 3:
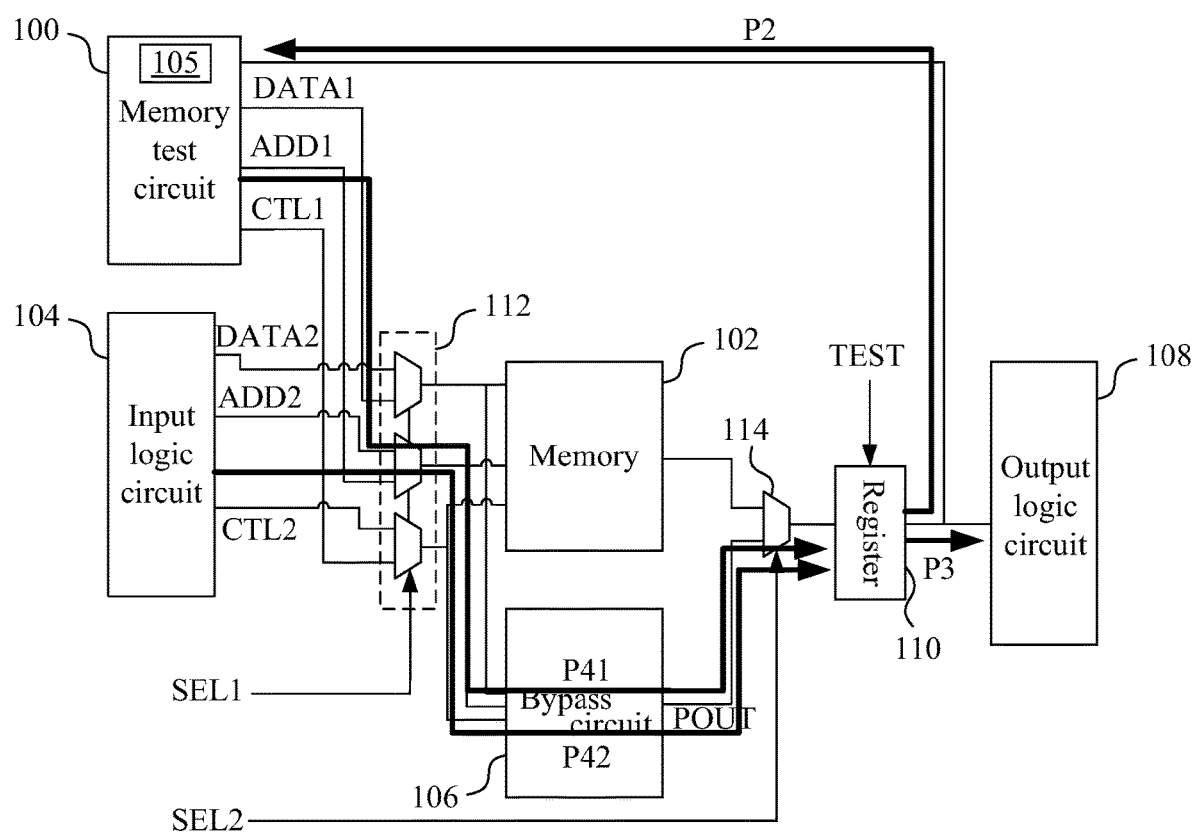
FIG. 3 is a block diagram of the test system operated in either the second test mode or the third test mode in an embodiment of the present invention.

Reference is now made to FIG. 3. FIG. 3 is a block diagram of the test system 1 operated in either the second test mode or the third test mode in an embodiment of the present invention.

In the second test mode, according to the connection of the multiplexer 112 controlled by the selection signal SEL1, either the memory test circuit 100 transmits the first test signal including such as, but not limited to the data signal DATA1, the address signal ADD1 and the control signal CTL1 or the input logic circuit 104 transmits the second test signal including the data signal DATA2, the address signal ADD2 and the control signal CTL2 to the bypass circuit 106.

Subsequently, the bypass circuit 106 outputs a bypass output test signal POUT. According to the connection of the multiplexer 114 controlled by the selection signal SEL2, the bypass output test signal POUT is transmitted to the register 110 to be stored. The scan test can be performed through the register 110 to test the fourth path, either P41 or P42, from either the memory test circuit 100 or the input logic circuit 104 to the bypass circuit 106 and further to the register 110.

In an embodiment, the scan test can be performed by using the register 110 to transmit the test signal to the memory test circuit 100 to perform comparison to test the logic function of the memory test circuit 100 itself.

Under such a condition, besides performing test on the logic function of the memory test circuit 100, the second path P2 from the register 110 to the memory test circuit 100 can be tested.

The scan test can also be performed by using the register 110 to transmit the scan test signal to the output logic circuit 108. A third path P3 from the register 110 to the output logic circuit 108 can be tested.

It is appreciated that if the register 110 is absent, the paths of the test that can be performed in the second test mode is either from the memory test circuit 100 to the bypass circuit 106 further to the memory test circuit 100, from the memory test circuit 100 to the bypass circuit 106 further to the output logic circuit 108, from the input logic circuit 104 to the bypass circuit 106 further to the memory test circuit 100 or from the input logic circuit 104 to the bypass circuit 106 further to the output logic circuit 108.

However, when the register 110 is present, the paths of the scan test can be distinguished to a path from the memory test circuit 100 to the register 110, a path from the input logic circuit 104 to the register 110, a path from the register 110 to the memory test circuit 100 and a path from the register 110 to the output logic circuit 108. As a result, due to the existence of the register 110, each of the paths that can be tested is shorter. The timing issue in the circuit design is easier to be overcome.

In another embodiment, in the third test mode, either the memory test circuit 100 transmits the first test signal including such as, but not limited to, the data signal DATA1, the address signal ADD1 and the control signal CTL1 or the input logic circuit 104 transmits the second test signal including the data signal DATA2, the address signal ADD2 and the control signal CTL2 to the bypass circuit 106. The bypass circuit 106 further outputs the bypass output test signal POUT to be stored in the register 110 to perform test based on a third transmission result such that the fourth path, i.e. P41 and P42, can be tested.

Subsequently, the register 110 outputs a third test signal TEST through the connected scan chain to either the memory test circuit 100 or the output logic circuit 108 to perform test based on a fourth transmission result. The second path P2 and the third path P3 can be tested. The third test signal TEST can be different from the second test signal, and can be inputted to the register 110 from a host (not illustrated) external to the test system 1 through the scan chain.

Figure 4:
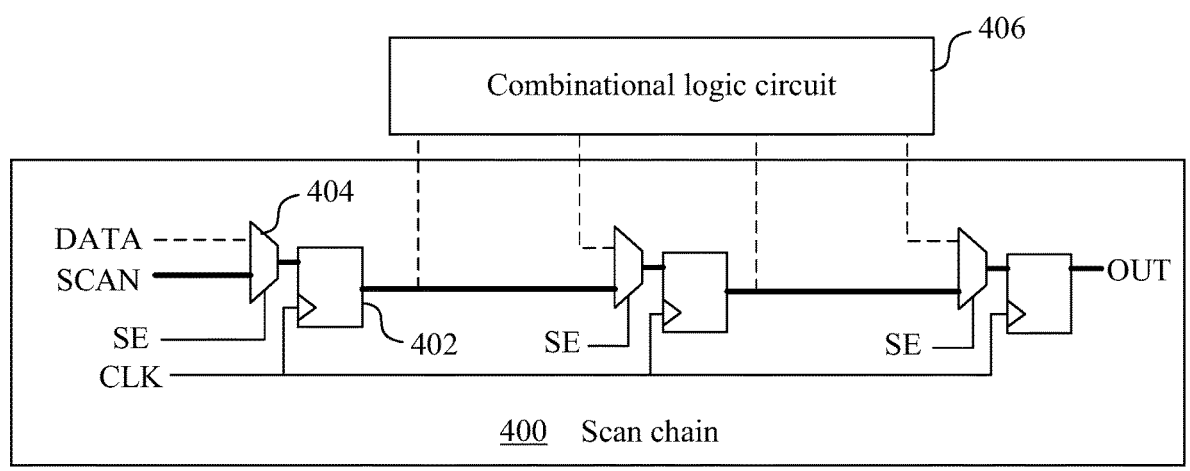
FIG. 4 is a diagram of a scan chain in an embodiment of the present invention.

Reference is now made to FIG. 4. FIG. 4 is a diagram of a scan chain 400 in an embodiment of the present invention.

The scan chain 400 includes a multiple of shift registers. Take the shift register 402 illustrated in FIG. 4 as an example, the shift register 402 is operated according to the clock signal CLK, selects the data signal DATA as the input in the operation mode according to the selection signal SE applied to the multiplexer 404 and transmits the data signal DATA through the path illustrated by a dash line to the combinational logic 406. In the scan mode, the shift register 402 selects the scan signal SCAN as the input and transmits the scan signal SCAN through the path illustrated by a solid line to the next stage of shift register until the last stage of shift register generates an output signal OUT.

In an embodiment, each of the memory test circuit 100, the input logic circuit 104 and the output logic circuit 108 includes at least one internal register. The register 110 can treat the third test signal TEST as the scan signal SCAN such that the shift registers of the scan chain 400 outputs and transmits the output signal OUT to the internal register of either the memory test circuit 100 or the output logic circuit 108. The second path P2 and the third path P3 can be tested.

In some technologies, in order to avoid the timing error of the signal transmission, three registers are required to be disposed each corresponding to the memory test circuit 100, the output logic circuit 108 and the bypass circuit 106 to provide the mechanism of the pipeline register. Besides, under such a configuration, some of the paths among the memory test circuit 100, the output logic circuit 108 and the bypass circuit 106 can not be tested. The coverage of the test is thus decreased.

As a result, by disposing the register 110, the test system 1 of the present invention can use the register 110 as the pipeline register of the output logic circuit 108 in the operation mode. In the test mode, the register 110 not only acts as the pipeline register of the memory test circuit 100 but also provides a storage mechanism to the bypass circuit 106. The cost of the hardware is greatly reduced. Further, due to the common path formed by the register 110, the test system 1 can perform test on all the possible paths among the memory test circuit 100, the output logic circuit 108 and the bypass circuit 106, including the first path P1, the second path P2, the third path P3 and the fourth path P4. The test coverage can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A test system, comprising:
a memory test circuit;
a memory electrically coupled to the memory test circuit;
an input logic circuit electrically coupled to the memory;
a bypass circuit selectively electrically coupled to one of the memory test circuit and the input logic circuit;
an output logic circuit; and
a register comprising an input terminal and an output terminal, wherein the input terminal of the register is selectively electrically coupled to one of the memory and the bypass circuit, and the output terminal of the register is directly and electrically coupled to the memory test circuit and the output logic circuit, and the register is operated as a pipeline register of the memory test circuit and the output logic circuit;
wherein in a first test mode, the memory test circuit transmits a first test signal to the memory such that the memory outputs a memory output test signal to be stored in the register and further transmitted to the memory test circuit or the output logic circuit, and the memory test circuit performs test to the memory based on a first transmission result transmitted from the register after the memory output test signal is stored in the register,
wherein in a second test mode, either the memory test circuit transmits the first test signal or the input logic circuit transmits a second test signal to the bypass circuit, the bypass circuit outputs a bypass output test signal to be stored in the register and the register further transmits the bypass output test signal to either the memory test circuit or the output logic circuit to perform test based on a second transmission result, and
wherein in a third test mode, either the memory test circuit transmits the first test signal or the input logic circuit transmits the second test signal to the bypass circuit, the bypass circuit outputs the bypass output test signal to be stored in the register to perform test based on a third transmission result, and the register transmits a third test signal through a scan chain to either the memory test circuit or the output logic circuit to perform test based on a fourth transmission result.

2. The test system of claim 1, wherein in the first test mode, a first path from the memory to the register and a second path from the register to the memory test circuit are tested.

3. The test system of claim 1, wherein in the second test mode, when the register transmits the bypass output test signal to the memory test circuit, a fourth path from either the memory test circuit or the input logic circuit to the bypass circuit and further to the register and a second path from the register to the memory test circuit are tested;
in the second test mode, when the bypass output test signal is stored in the register and is further transmitted to the output logic circuit, the fourth path and a third path from the register to the logic output circuit are tested.

4. The test system of claim 1, wherein in the third test mode, the third transmission result is to test a fourth path from either the memory test circuit or the input logic circuit to the bypass circuit and further to the register, and the fourth transmission result is to test a second path from the register to the memory test circuit or a third path from the register to the output logic circuit.

5. The test system of claim 1, further comprising a first multiplexer configured to electrically couple the memory and the register in the first test mode and electrically coupled the bypass circuit and the register in the second test mode and the third test mode.

6. The test system of claim 1, further comprising a second multiplexer configured to electrically couple one of the memory test circuit and the input logic circuit to the bypass circuit.

7. The test system of claim 1, wherein the memory test circuit is a built-in self test (BIST) circuit.

8. The test system of claim 1, wherein in an operation mode, the input logic circuit transmits an input operation signal to the memory and the memory outputs a memory output operation signal to be stored in the register and further transmitted to the output logic circuit such that a signal received by the output logic circuit is not affected by a latency of the memory.

9. The test system of claim 1, wherein each of the memory test circuit, the input logic circuit and the output logic circuit includes at least one internal register.

* * * * *